US011710710B2

(12) United States Patent
Jhothiraman et al.

(10) Patent No.: US 11,710,710 B2
(45) Date of Patent: *Jul. 25, 2023

(54) MICROELECTRONIC DEVICES WITH A POLYSILICON STRUCTURE ADJACENT A STAIRCASE STRUCTURE, AND RELATED METHODS

(71) Applicant: Micron Technology, Inc., Boise, ID (US)

(72) Inventors: Jivaan Kishore Jhothiraman, Meridian, ID (US); John M. Meldrim, Boise, ID (US); Lifang Xu, Boise, ID (US)

(*) Notice: Subject to any disclaimer, the term of this patent is extended or adjusted under 35 U.S.C. 154(b) by 52 days.

This patent is subject to a terminal disclaimer.

(21) Appl. No.: 17/443,616

(22) Filed: Jul. 27, 2021

(65) Prior Publication Data

US 2021/0358868 A1 Nov. 18, 2021

Related U.S. Application Data

(63) Continuation of application No. 16/674,644, filed on Nov. 5, 2019, now Pat. No. 11,088,088.

(51) Int. Cl.
*H01L 23/00* (2006.01)
*H01L 23/522* (2006.01)
*H01L 23/528* (2006.01)
*H01L 23/535* (2006.01)
*H01L 21/768* (2006.01)
(Continued)

(52) U.S. Cl.
CPC ...... *H01L 23/562* (2013.01); *H01L 21/76816* (2013.01); *H01L 21/76831* (2013.01); *H01L 21/76877* (2013.01); *H01L 21/76895* (2013.01); *H01L 23/5226* (2013.01); *H01L 23/5283* (2013.01); *H01L 23/535* (2013.01); *H10B 41/27* (2023.02); *H10B 41/35* (2023.02); *H10B 41/41* (2023.02); *H10B 43/27* (2023.02);
(Continued)

(58) Field of Classification Search
CPC ........ H01L 27/11529; H01L 21/76877; H01L 21/76831; H01L 27/1157; H01L 21/76816; H10B 41/27; H10B 43/27
See application file for complete search history.

(56) References Cited

U.S. PATENT DOCUMENTS 6,465,045 B1 10/2002 Heuer et al.
6,479,166 B1 11/2002 Heuer et al.
(Continued)

OTHER PUBLICATIONS

Kothari et al., U.S. Appl. No. 16/235,665, entitled Methods of Forming a Semiconductor Device and Related Semiconductor Devices, filed Dec. 28, 2018.

*Primary Examiner* — Changhyun Yi
(74) *Attorney, Agent, or Firm* — TraskBritt

(57) ABSTRACT

Microelectronic devices include a stack structure of insulative structures vertically alternating with conductive structures and arranged in tiers forming opposing staircase structures. A polysilicon fill material substantially fills an opening (e.g., a high-aspect-ratio opening) between the opposing staircase structures. The polysilicon fill material may have non-compressive stress such that the stack structure may be partitioned into blocks without the blocks bending and without contacts—formed in at least one of the polysilicon fill material and the stack structure—deforming, misaligning, or forming electrical shorts with neighboring contacts.

20 Claims, 13 Drawing Sheets

(51) Int. Cl.
*H10B 41/27* (2023.01)
*H10B 41/35* (2023.01)
*H10B 41/41* (2023.01)
*H10B 43/27* (2023.01)
*H10B 43/35* (2023.01)
*H10B 43/40* (2023.01)

(52) U.S. Cl.
CPC ............. *H10B 43/35* (2023.02); *H10B 43/40* (2023.02); *H01L 2221/1063* (2013.01)

(56) References Cited

U.S. PATENT DOCUMENTS

| | | |
|---|---|---|
| 10,002,787 B2 | 6/2018 | Yu et al. |
| 10,147,638 B1 | 12/2018 | Williamson et al. |
| 11,088,088 B2 * | 8/2021 | Jhothiraman ..... H01L 27/11556 |
| 2014/0339621 A1 * | 11/2014 | Simsek-Ege ...... H01L 29/42332 |
| | | 438/588 |
| 2015/0228623 A1 | 8/2015 | Oh et al. |
| 2016/0329345 A1 | 11/2016 | Hu et al. |
| 2017/0179153 A1 | 6/2017 | Ogawa et al. |
| 2017/0301685 A1 | 10/2017 | Dorhout et al. |
| 2018/0366481 A1 | 12/2018 | Kothari et al. |
| 2019/0371809 A1 | 12/2019 | Yun et al. |
| 2020/0395373 A1 | 12/2020 | Huo et al. |

* cited by examiner

HYPOTHETICAL 3D NAND MEMORY DEVICE SRUCTURE WITH CONVENTIONAL FILL MATERIAL

MICROELECTRONIC DEVICES WITH A POLYSILICON STRUCTURE ADJACENT A STAIRCASE STRUCTURE, AND RELATED METHODS

CROSS-REFERENCE TO RELATED APPLICATION

This application is a continuation of U.S. patent application Ser. No. 16/674,644, filed Nov. 5, 2019, now U.S. Pat. No. 11,088,088, issued Aug. 10, 2021, the disclosure of which is hereby incorporated in its entirety herein by this reference.

TECHNICAL FIELD

Embodiments of the disclosure relate to the field of microelectronic device design and fabrication. More particularly, the disclosure relates to microelectronic devices (e.g., memory devices, such as 3D NAND memory devices) having staircase regions at least partially filled with polysilicon fill material, to related methods for forming such devices, and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of memory cells (e.g., non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line.

A 3D NAND memory device also includes electrical connections between, e.g., access lines (e.g., word lines) and other conductive structures of the device so that the memory cells of the vertical strings can be selected for writing, reading, and erasing operations. One method of forming such electrical connections includes forming a so-called "staircase" structure having "steps" (or otherwise known as "stairs") at edges (e.g., lateral ends) of the tiers of the stack structure. For example, a hypothetical 3D NAND memory device structure 100 is illustrated in FIG. 1. The hypothetical 3D NAND memory device structure 100 includes a stack structure 102 including conductive materials vertically alternating with insulative materials arranged in tiers over a base material 108. The stack structure 102 also includes opposing staircase structures 104 that include steps 106 (e.g., stairs) along lateral ends of the tiers. A fill material 110 may fill at least a portion of a volume (e.g., opening) between the opposing staircase structures 104 of the hypothetical 3D NAND memory device structure 100. The hypothetical 3D NAND memory device structure 100 may be partitioned into blocks 118 (e.g., a first block 120, and a second block 122) by a slit 112 extending through the fill material 110 and by other slits 114 extending through the stack structure 102.

The steps 106 of the staircase structures 104 may serve as contact regions for access lines (e.g., word lines) of the hypothetical 3D NAND memory device structure 100. Contacts 116 of conductive material may be formed, through the fill material 110, leading to the contact areas at the steps 106 in an effort to gain electrical access to the access lines or other conductive structures of the hypothetical 3D NAND memory device structure 100. However, using conventional fill material 110 (e.g., an oxide material) in conventional structures and formed by conventional methods may result in the blocks 118 (e.g., the first block 120 and the second block 122) becoming deformed (e.g., bent) upon forming slit 112 and other slits 114.

The deformations may include neighboring blocks 118 (e.g., the first block 120 and the second block 122) coming into physical contact with one another, such as where illustrated at pinch-off area 124. Thus, while slit 112 may be intended to extend fully through the fill material 110, the slit 112 may be closed off along the height of the fill material 110 due to the bending of the blocks 118 (e.g., first block 120, second block 122) at the pinch-off area 124.

The bending of the blocks 118 (e.g., the first block 120, the second block 122) may also result in problems with the electrical connections intended to be formed by the contacts 116. For example, the contacts 116 may become misaligned relative to the contact regions with which they are meant to correspond. In some instances, one or more of the contacts 116, meant to be in physical contact with a contact region of an access line, may become shifted or bent such that the contact 116 lacks any or sufficient physical and electrical contact with its corresponding contact region (e.g., its corresponding "landing"), such as at misalignment areas 126. In other instances, due to contact misalignment, contacts 116 may unintentionally be in too close a proximity with one another, either with direct physical contact or with near proximity, such as at breakdown area 128, so as to form electrical connections (e.g., shorts) between neighboring contacts 116 where no electrical connection was intended. Such breakdown area 128 problems may be particularly challenging when one or more of the contacts 116 are formed before the stack structure 102 has been partitioned into the blocks 118 while one or more other of the contacts 116 are formed after the partitioning.

Conventional fill material 110 may also exhibit other deformations, which may contribute to the aforementioned deformations and problems with the contacts 116. For example, conventional fill material 110 (e.g., oxide material) may be prone to structural defects (e.g., voids, cracks, delaminations, and/or seams (e.g., seam 130)) within the fill material 110 (e.g., upon exposure to high temperatures of high-temperature thermal processing stages during forming the hypothetical 3D NAND memory device structure 100). These structural defects may be further complicated as devices with staircase structures are scaled to increase device density, such as by narrowing and increasing the aspect ratio (e.g., height-to-width ratio) of the opening between opposing staircase structures 104 to be filled with the fill material 110.

While FIG. 1 illustrates contacts 116 only in the first block 120 and illustrates the fill material 110 having the seam 130 only in the second block 122, such illustrations are only for simplicity of the discussion. Also, while misalignment areas 126 are illustrated only along lateral ends (e.g., at steps 106) of the tiers of the stack structure 102, misalignments may also occur where contacts 116 extend to or into the base material 108. Though not illustrated, the base material 108 may also include conductive structures (e.g., contact regions, landing pads) to which the contacts 116 may be intended to provide electrical access.

Accordingly, forming staircase structures for microelectronic devices (e.g., 3D memory devices, such as 3D NAND memory devices) without the aforementioned deformations remains challenging.

DETAILED DESCRIPTION

Figure 1:
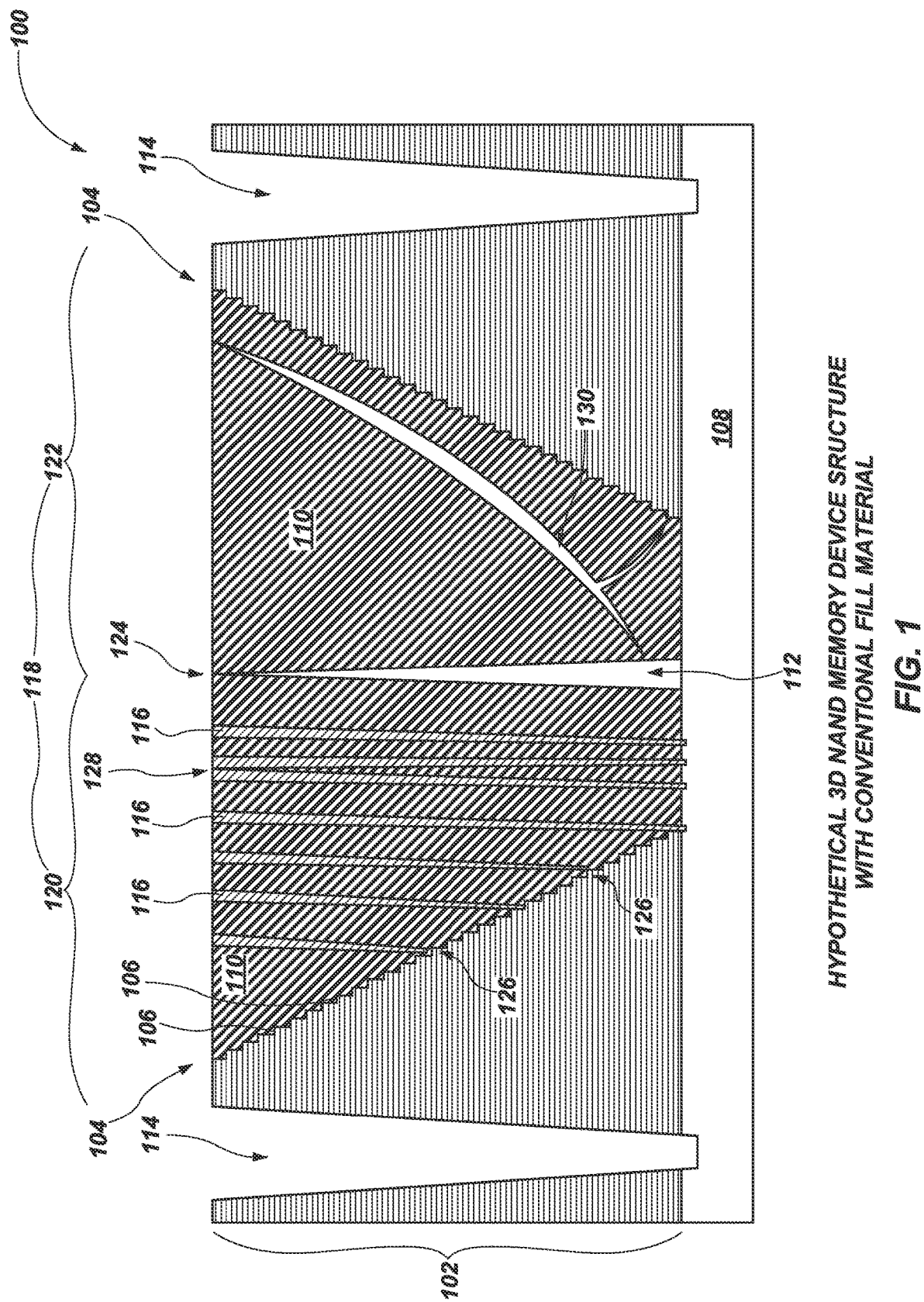
FIG. 1 is a cross-sectional, elevational, schematic illustration of a hypothetical 3D NAND memory device structure including staircase structures, wherein the hypothetical 3D NAND memory device structure includes a conventional fill material between horizontally neighboring, opposing staircase structures.

Structures (e.g., microelectronic device structures), apparatuses (e.g., microelectronic devices), and systems (e.g., electronic systems), according to embodiments of the disclosure, include a stack structure of conductive materials vertically alternating with insulative materials, arranged in tiers formed into opposing staircase structures (also referred to, in the art, as "stadium" structures) with steps along lateral ends (e.g., horizontal edges) of the tiers. Polycrystalline silicon (e.g., also referred to, herein, as a "polysilicon fill material") fills at least a portion of a volume between the opposing staircase structures. The polysilicon fill material has (e.g., exhibits) non-compressive stress (e.g., tensile stress) such that, once slits (e.g., trenches, openings, slots) are formed through the polysilicon fill material and through the stack structure to partition the stack structure into blocks, no residual compressive stress may remain. Therefore, the blocks—and contacts therein—may not bend, misalign, or otherwise structurally deform. The avoidance of such structural deformations of the blocks and contacts may be achieved, even with the polysilicon fill material being formed in high-aspect ratio openings. The polysilicon fill material may be formed with a minimal number of processing acts (e.g., stages). For example, in some embodiments, the polysilicon fill material may be formed by a single deposition act and subsequent planarization to wholly fill the volume between the opposing staircase structures, avoiding multiple cycles of deposition and etch acts that may otherwise be used for forming conventional fill materials (e.g., the fill material 110 (FIG. 1)). Therefore, the polysilicon fill material may enable formation of a more reliable microelectronic device structure (e.g., for a 3D memory device, such as a 3D NAND memory device) at relatively low cost, compared to conventional structures using conventional fill materials (e.g., the fill material 110 (FIG. 1)) and conventional fabrication methods.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is(are) not necessarily in contact with an atmosphere or non-solid environment. Structure(s) or material(s) "exposed" within an opening may be adjacent or in contact with other structure(s) or material(s) that is(are) disposed within the opening.

As used herein, the term "sacrificial material" means and includes a material that is formed and/or employed during a fabrication process but which is subsequently removed, prior to completion of the fabrication process.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane.

As used herein, the terms "vertical" or "longitudinal" mean and include a direction that is perpendicular to a primary surface of the substrate on which a referenced material or structure is located. The height of a respective material or structure may be defined as a dimension in a vertical plane.

As used herein, the terms "thickness," "thinness," or "height" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one element's or feature's relationship to another element(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprises," "comprising," "includes," and/or "including" specify the presence of stated features, structures, stages, operations, elements, materials, components, and/or groups, but do not preclude the presence or addition of one or more other features, structures, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

Figure 2:
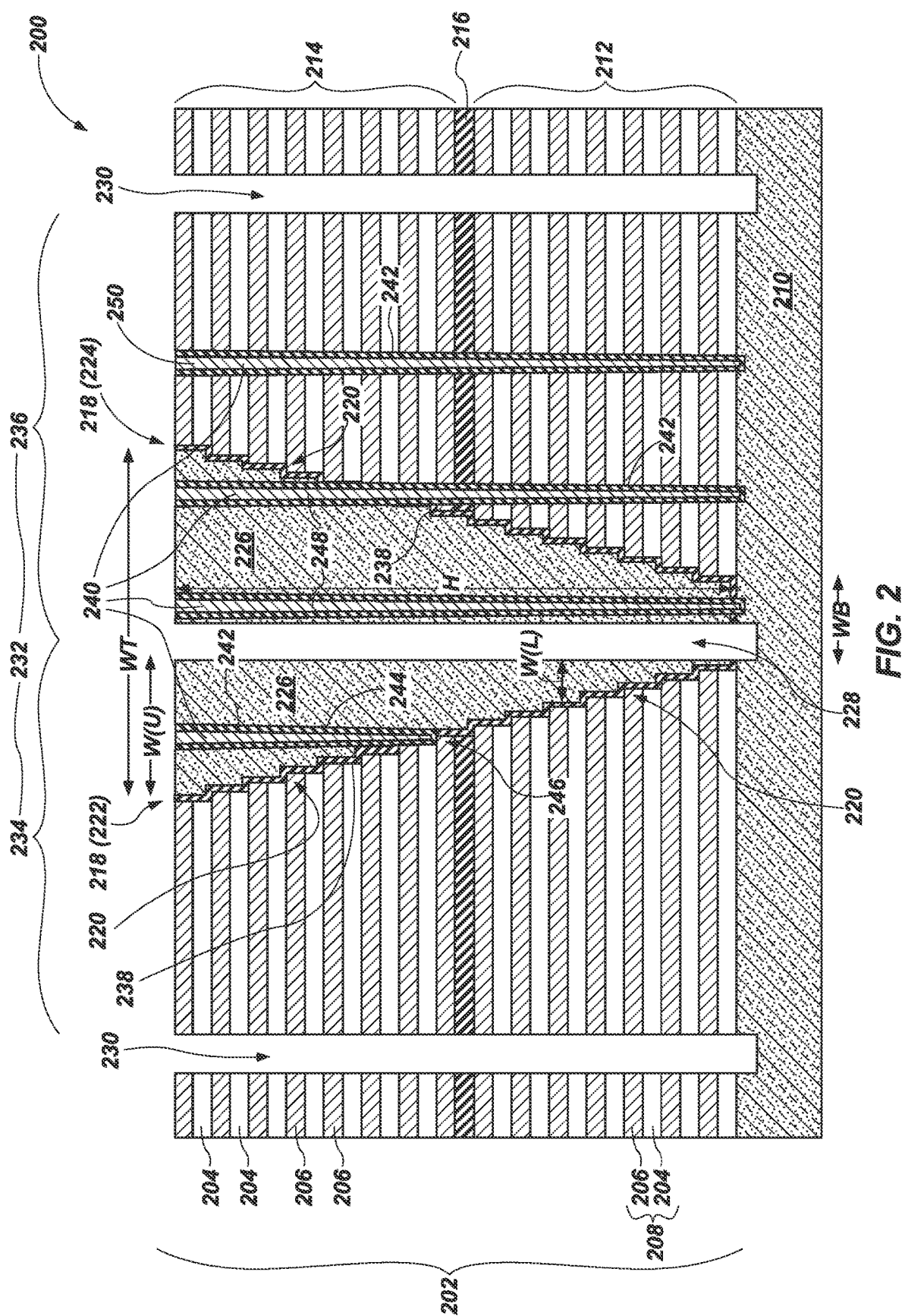
FIG. 2 is a cross-sectional, elevational, schematic illustration of a microelectronic device structure including a polysilicon fill material between opposing staircase structures, in accordance with embodiments of the disclosure.
Figure 3:
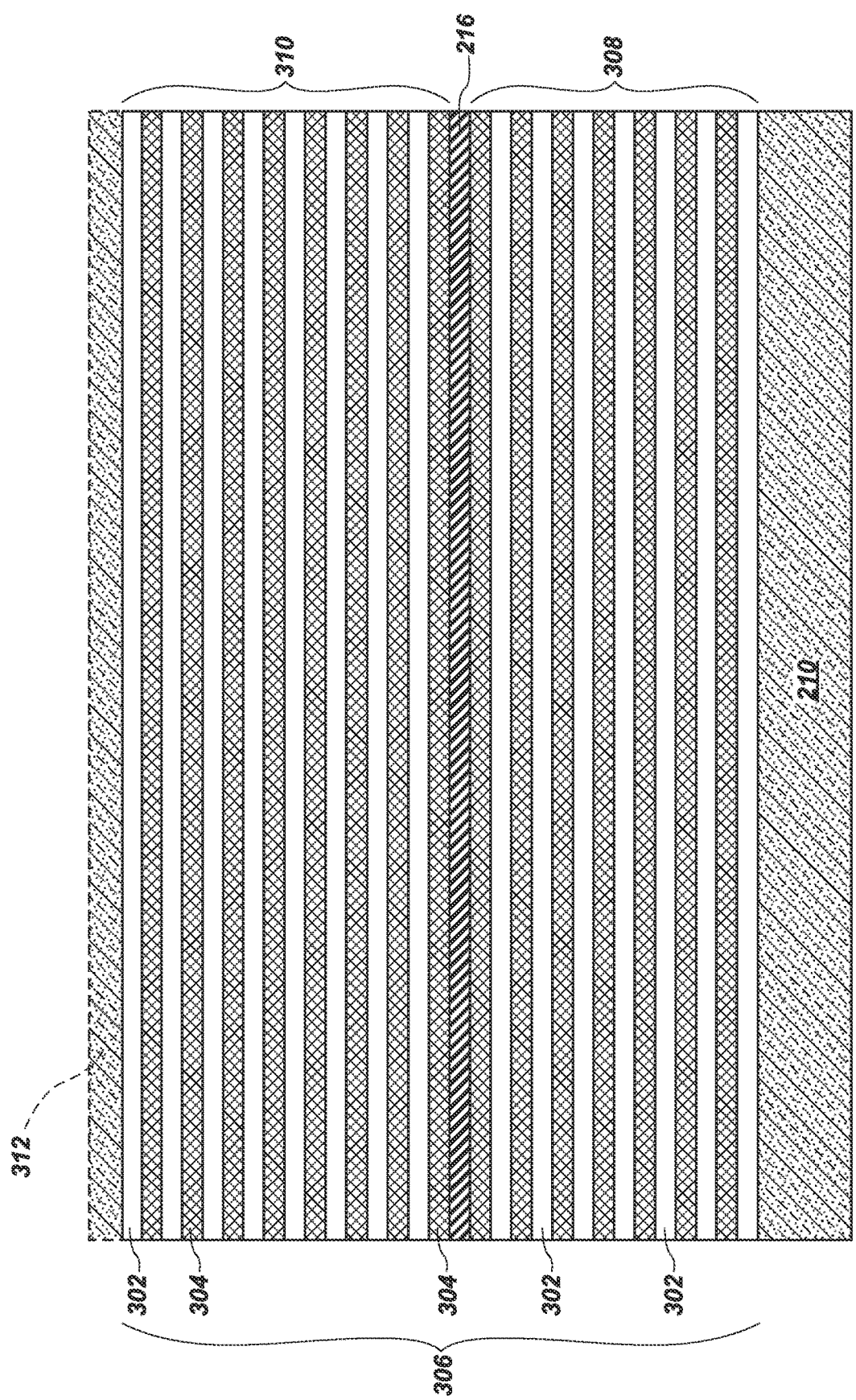
FIG. 3 through FIG. 12 are cross-sectional, elevational, schematic illustrations during various stages of processing to fabricate the microelectronic device structure illustrated in FIG. 2, according to embodiments of the disclosure.

FIG. 2 illustrates a microelectronic device structure 200 (e.g., a memory device structure, such as a 3D NAND memory device structure), according to embodiments of the disclosure, for an apparatus (e.g., a memory device, such as a 3D NAND memory device). The microelectronic device structure 200 includes a stack structure 202 including insulative structures 204 vertically alternating with (e.g., interleaved with) conductive structures 206. Tiers 208 of the stack structure 202 include at least one of the insulative structures 204 and at least one of the conductive structures 206. The stack structure 202 may be supported on a base material 210 (e.g., a substrate). The base material 210 may include or be configured as a drain/source material and may include or be operatively connected to a bit line. Within the base material 210 may be conductive regions for making electrical connections with other conductive structures of the microelectronic device structure 200.

In some embodiments, the insulative structures 204 of the stack structure 202 comprise at least one electrically insulative material (e.g., a dielectric material, such as silicon dioxide ($SiO_2$)), and the conductive structures 206 comprise at least one electrically conductive material (e.g., metals, such as tungsten (W); alloys; conductive metallic compounds, such as titanium nitride (TiN); conductively-doped polysilicon). The conductive structures 206 may serve as gate structures (e.g., word line plates, access line plates) for vertical strings of memory cells extending through the stack structure 202.

In some embodiments, the stack structure 202 is configured to have a lower deck 212 and an upper deck 214, each including some of the tiers 208 of the vertically alternating insulative structures 204 and conductive structures 206. The lower deck 212 and the upper deck 214 may be separated by an inter-deck dielectric material 216 (e.g., an oxide, such as silicon dioxide; a nitride, such as silicon nitride). While FIG. 2 illustrates only two such decks of the stack structure 202, in other embodiments, only one deck or more than two decks may be included in the stack structure 202 of the microelectronic device structure 200.

The stack structure 202 is formed to include opposing staircase structures 218 (also known in the art as "stadium" structures) including steps 220 (e.g., stairs) at horizontal edges (e.g., lateral ends) of the tiers 208 of the stack structure 202. As illustrated in FIG. 2, the opposing staircase structures 218 include a first staircase structure 222 (e.g., a forward staircase structure, descending from left to right in the figure) and a second staircase structure 224 (e.g., a reverse staircase structure, ascending from left to right in the figure). The second staircase structure 224 may mirror the first staircase structure 222, as "opposing" staircase structures 218.

A polysilicon fill material 226 at least partially fills an opening (e.g., a volume) between the opposing staircase structures 218. The opening may be a high-aspect-ratio opening. As used herein, a "high-aspect-ratio opening" is an opening defining a height-to-width ratio of about 1:1 or greater (e.g., about 2:1 or greater, about 3:1 or greater, about 4:1 or greater). The aspect ratio of the opening may be defined based on the largest width of the opening, e.g., a width WT along the top of the opening (rather than a width WB at the bottom of the opening), relative to a height H of the opening. Width WT may be greater than width WB. In other embodiments, width WT may be substantially equal to width WB, e.g., where the opposing staircase structures 218 are steep.

A slit 228 may extend through the polysilicon fill material 226, and other slits 230 may extend through the tiers 208 of the stack structure 202. The slit 228 and the other slits 230 may partition the stack structure 202 into multiple blocks 232. As illustrated in FIG. 2, the blocks 232 may, for example, include a first block 234 and a second block 236. Each of the blocks 232 individually includes polysilicon fill material 226 along one lateral side defined by slit 228. On the other lateral side of each of the blocks 232, the other slits 230 border a sidewall of the blocks 232, which sidewall is vertical or angled but not defining a staircase structure. In other embodiments, the other slits 230 horizontally intervene between additional opposing staircase structures, of the stack structure 202, such that each of the tiers 208 has steps 220 at both horizontal edges (e.g., lateral ends).

The other slits 230 may be partially or wholly filled by another fill material. In some embodiments, the other fill material may comprise a conventional fill material (e.g., an oxide, a nitride). In other embodiments, the polysilicon fill material 226 may also substantially fill the other slits 230. These other such embodiments may include the additional opposing staircase structures.

Because the polysilicon fill material 226 at least partially fills a volume between the opposing staircase structures 218, the polysilicon fill material 226 defines a greater horizontal width W(U) at upper elevations than a horizontal width W(L) defined at lower elevations.

A dielectric liner 238 is formed on the opposing staircase structures 218 (including on the steps 220 thereof) of the stack structure 202, such that the polysilicon fill material 226 does not directly physically contact the conductive structures 206. The dielectric liner 238 may include one or more dielectric materials, such as one or more of a dielectric oxide (e.g., silicon dioxide), a dielectric nitride (e.g., silicon nitride), and another dielectric material. The material of the dielectric liner 238 may be resistant to an etchant (e.g., a hot phosphorous etchant) used during a so-called "replacement gate" (also referred to in the art as a "gate last") process employed during the formation of the microelectronic device structure 200, as discussed further below. In other embodiments, such as embodiments wherein the fabrication method does not use a replacement gate process, the material of the dielectric liner 238 may not necessarily be resistant to, e.g., a hot phosphorous etchant. For example, in such embodiments, the dielectric liner 238 may comprise a silicon nitride. Nonetheless, the dielectric liner 238 electrically insulates the conductive material of the conductive structures 206 from the polysilicon fill material 226.

In some embodiments, the dielectric liner 238 may consist of a single dielectric material providing a single material layer. In other embodiments, the dielectric liner 238 may comprise multiple dielectric materials, e.g., multiple layers of different dielectric materials or multiple layers of the same dielectric material.

Contacts 240 extend through the polysilicon fill material 226, the materials of the stack structure 202, or both to provide electrical connections between the conductive structures 206 and other conductive structures of the microelectronic device (e.g., memory device) including the microelectronic device structure 200. The contacts 240 may, therefore, include one or more of word line contacts, source contacts, drain contacts, and other types of contacts. The contacts 240 may be formed of and include at least one electrically conductive material. The electrically conductive material(s) of the contacts 240 may be substantially the same as, or may be different than, the electrically conductive material(s) of the conductive structures 206. Each of the contacts 240 is lined by a contact dielectric liner 242 formed of and including at least one dielectric material (e.g., a dielectric oxide, a dielectric nitride) that electrically insulates the contacts 240 (e.g., from the polysilicon fill material 226, from the conductive structures 206, from neighboring contacts 240).

The depth to which each of the contacts 240 individually extends may vary according to the function of the contacts 240. For example, some of the contacts 240—such as word line contact 244—may be formed to land on some of the steps 220 (serving as contact regions) of the opposing staircase structures 218, such as where indicated by arrow 246 in FIG. 2. At the landed-on step of the steps 220, the word line contact 244 may physically and electrically contact the one of the conductive structures 206 that partially defines the landed-on step. Each word line contact 244 may individually extend from an upper surface of the polysilicon fill material 226, through the polysilicon fill material 226, and to a step (of steps 220) of one of the opposing staircase structures 218.

As another example, some of the contacts 240—such as source/drain contacts 248—may be formed to land in contact with the source/drain regions of transistors (e.g., string driver transistors) within the base material 210. Some such source/drain contacts 248—such as the left contact of the illustrated source/drain contacts 248—may extend from an upper surface of the polysilicon fill material 226, through the polysilicon fill material 226, and to (e.g., into) the base material 210. Other of the source/drain contacts 248—such as the right contact of the illustrated source/drain contacts 248—may extend from an upper surface of the polysilicon fill material 226, through the polysilicon fill material 226, through at least some of the tiers 208 (including the conductive structures 206 and the insulative structures 204 of the tiers 208) of the stack structure 202, and to the source/drain region within the base material 210.

As still another example, some of the contacts 240—such as support contact 250—may be formed solely through the materials of the stack structure 202 (e.g., through the insulative structures 204 and the conductive structures 206), without extending through a portion of the polysilicon fill material 226. The support contact 250 may be configured to provide structural support to, e.g., the block (e.g., the second block 236) and so may or may not be in electrical connection with another conductive structure of a microelectronic device including the microelectronic device structure 200.

Accordingly, the contacts 240 of the microelectronic device structure 200 may extend vertically through one or more of the polysilicon fill material 226 and the stack structure 202, depending on the functions the contacts 240 provide. While FIG. 2 illustrates only four contacts 240, it should be appreciated that the microelectronic device structure 200 may include many more such contacts 240. The microelectronic device structure 200 may include any desired number of word line contacts (e.g., word line contact 244), source/drain contacts 248, and/or support contacts (e.g., support contact 250).

Likewise, the microelectronic device structure 200 may include any number of the word line contact 244 (including additional such word line contact 244 extending to different depths of the polysilicon fill material 226 and to different steps 220 of the staircase structure of the stack structure 202), the source/drain contacts 248, and/or the support contact 250.

Accordingly, disclosed is a microelectronic device comprising a stack structure comprising insulative structures vertically alternating with conductive structures and arranged in tiers forming opposing staircase structures having steps at lateral ends of the tiers. A polysilicon fill material substantially fills an opening between the opposing staircase structures. A dielectric liner is between the polysilicon fill material and staircase structures of the opposing staircase structures. At least one contact extends through one or more of the polysilicon fill material and the stack structure.

With reference to FIGS. 3 through 12, illustrated are various stages of a method of forming the microelectronic device structure 200 previously described with reference to FIG. 2. Vertically alternating insulative materials 302 (that will eventually become the insulative structures 204 of FIG. 2) and other materials 304 (that will eventually become the conductive structures 206 of FIG. 2) may be formed on or over the base material 210 by forming (e.g., depositing) the materials thereof in sequence, one after the other, from lower elevations to upper elevations. The insulative materials 302 include at least one electrically insulative material (e.g., a dielectric oxide material, such as silicon dioxide) described above with respect to the insulative structures 204 of FIG. 2. In some embodiments (e.g., embodiments in which the conductive structures 206 comprise "replacement gates"), the other materials 304 comprise at least one sacrificial material, such as a dielectric material (e.g., a dielectric nitride material, such as silicon nitride) that may be selectively removed relative to the insulative materials 302. In other embodiments, the other materials 304 may comprise an electrically conductive material (e.g., conductively doped polysilicon) of the conductive structures 206 of FIG. 2. Methods of forming stack structures of insulative materials 302 vertically alternating with other materials (e.g., other materials 304) are known in the art and so are not describe in detail herein.

A stack structure 306 of the vertically alternating materials may, in some embodiments, include the inter-deck dielectric material 216 dividing the stack structure 306 into a lower deck 308 (to become the lower deck 212 (FIG. 2)) and an upper deck 310 (to become the upper deck 214 (FIG. 2)).

In some embodiments, a sacrificial material 312 (e.g., a polysilicon material) may, optionally, be formed on or over the stack structure 306. In other embodiments, the sacrificial material 312 may be omitted, and the uppermost material of the stack structure 306 may be exposed going into the next fabrication stage, illustrated in FIG. 4.

Figure 4:
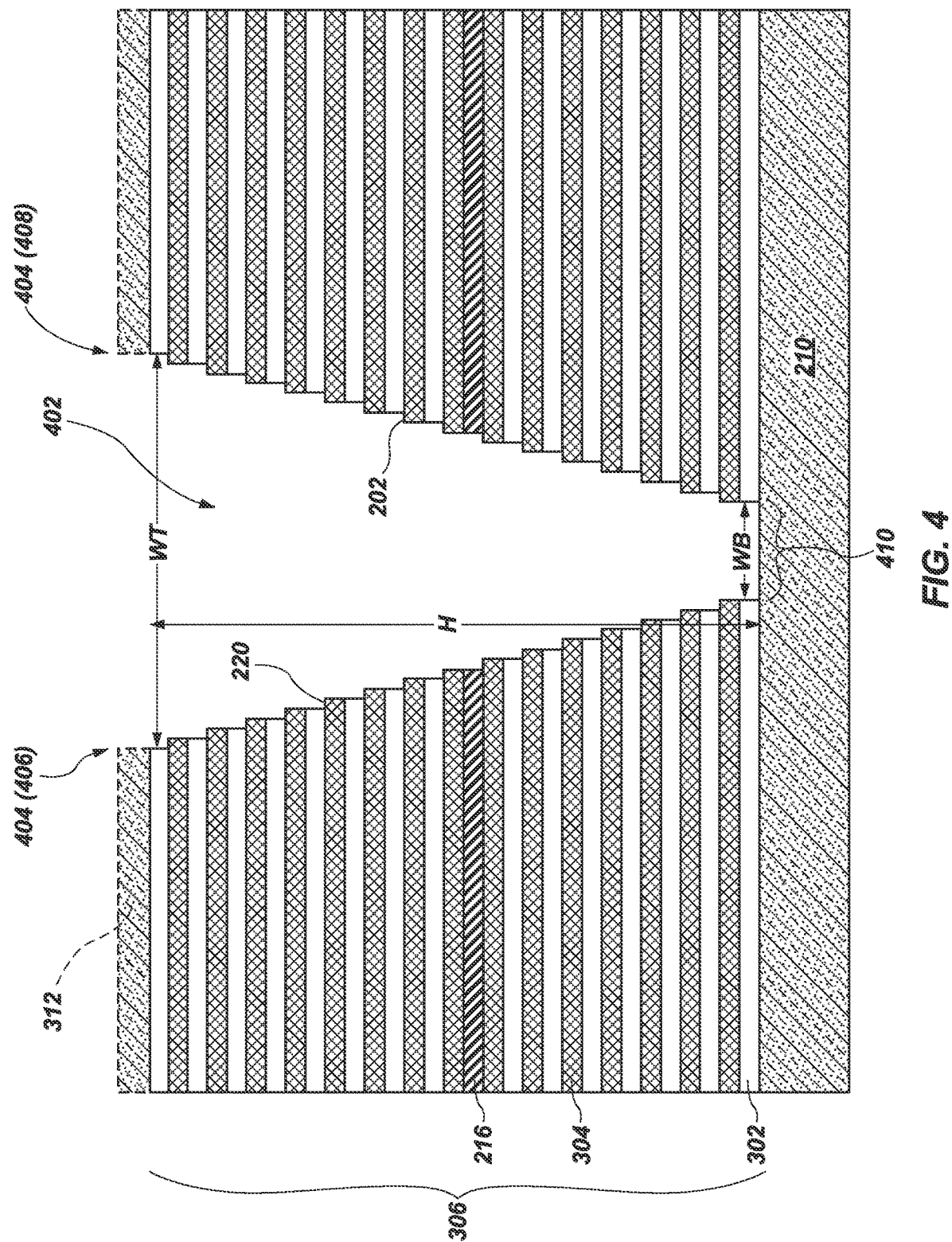

With reference to FIG. 4, an opening 402 is formed through the stack structure 306 (and the sacrificial material 312, if present) to form opposing staircase structures 404 of steps 220 along lateral ends of the materials of the stack structure 306. The opposing staircase structures 404 include a first staircase structure 406 and a second staircase structure 408, which may mirror the first staircase structure 406. The opening 402 exposes a portion 410 of the base material 210. The opening 402 may be a high-aspect-ratio opening (defined by a ratio of height H to top width WT equaling or exceeding about 1:1 (e.g., equaling or exceeding about 2:1)).

Figure 5:
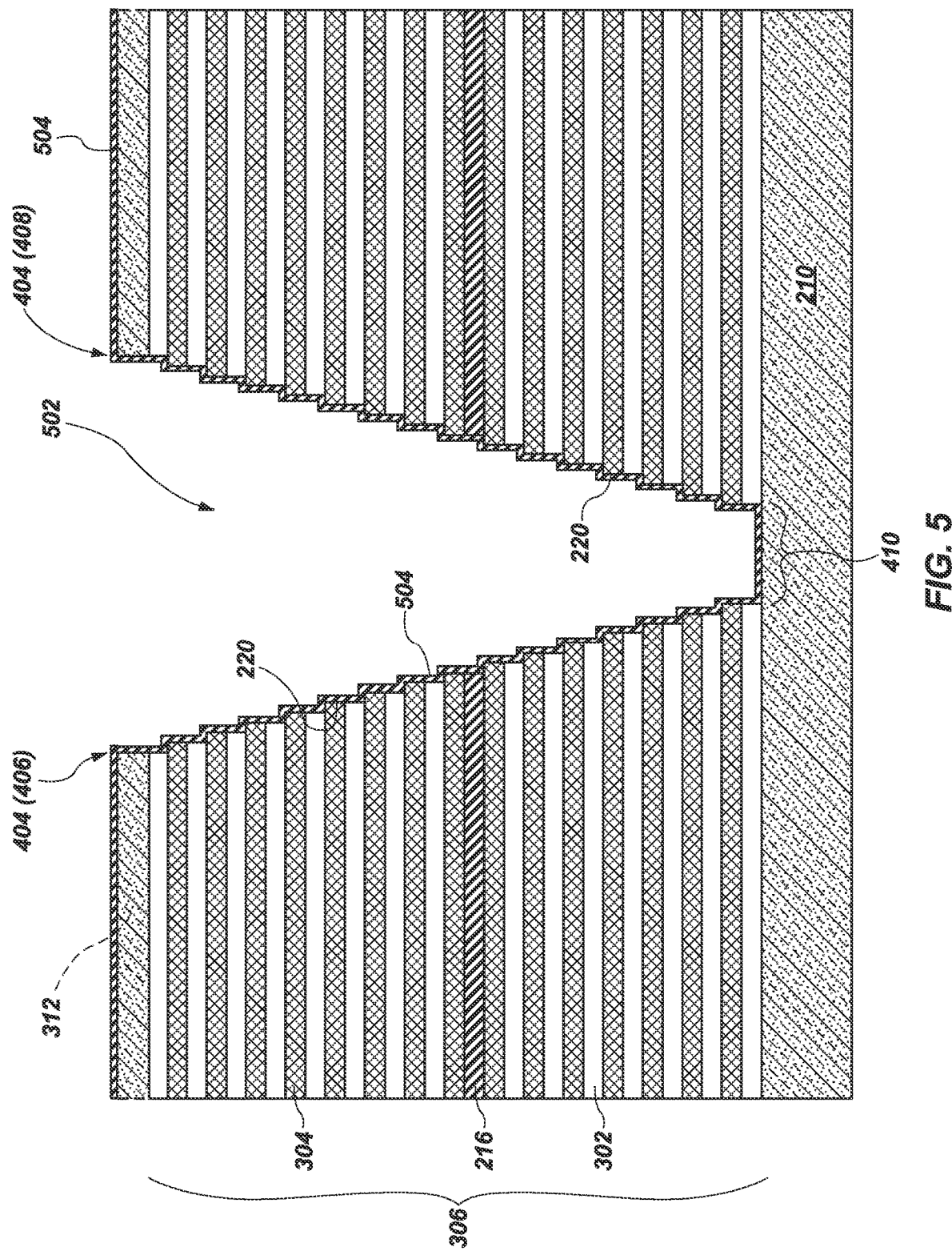

With reference to FIG. 5, a dielectric liner material 504 may then be formed (e.g., by ALD; by CVD, such as by a high-aspect ratio process (HARP) in the opening 402 (FIG. 4)), leaving opening 502 defined by the dielectric liner material 504 covering the steps 220 and covering the portion 410 of the base material 210. The dielectric liner material 504 may also cover an upper surface of the sacrificial material 312, if present. In embodiments in which the sacrificial material 312 is not present, the dielectric liner material 504 may cover an upper surface of an uppermost material of the stack structure 306 (e.g., an upper surface of an uppermost region of the insulative materials 302).

The dielectric liner material 504 may be formed of and include any of the materials described above with respect to the dielectric liner 238 of FIG. 2.

The dielectric liner material 504 may be thin, defining a thickness, adjacent the steps 220, of less than about 20 nm (e.g., within a range of from about 10 nm to about 20 nm). In some embodiments, the dielectric liner material 504 conforms to the topography (e.g., the steps 220) of the staircase structures 404. Therefore, the surface of the dielectric liner material 504 facing the opening 502 may also define steps, as illustrated in FIG. 5.

Figure 6:
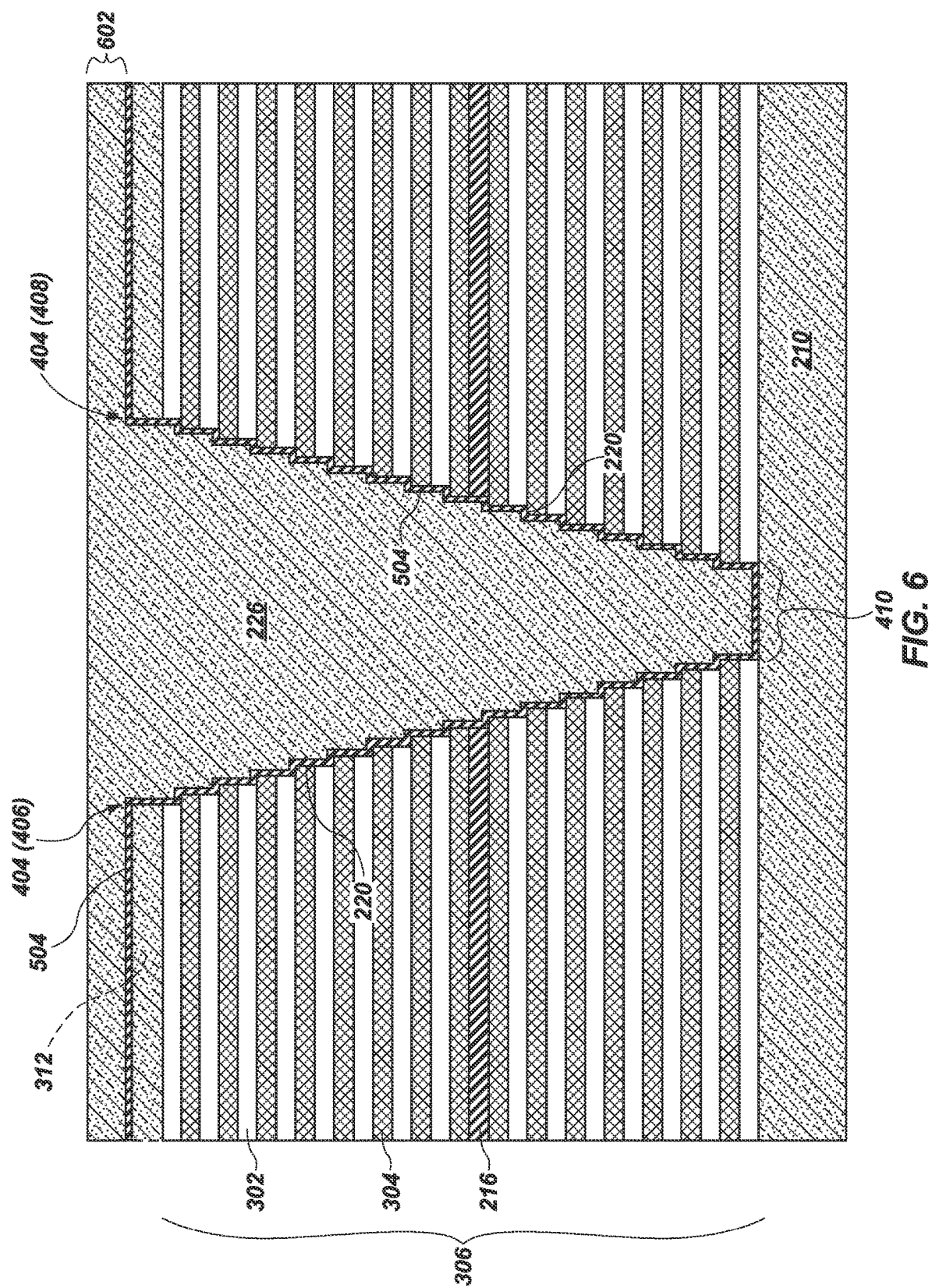

Within the opening 502, the polysilicon fill material 226 may then be formed, as illustrated in FIG. 6. In some embodiments, the polysilicon fill material 226 is formed in a single deposition act (e.g., stage) to completely fill the opening 502 of FIG. 5. In other embodiments, the polysilicon fill material 226 is formed in multiple deposition acts (e.g., stages), with or without material-removal (e.g., etching) acts between.

In some embodiments, the polysilicon fill material 226 may be formed by, e.g., CVD using precursor material formulated as a source for silicon (Si). For example, the precursor material may comprise, consist essentially of, or consist of one or more silanes, e.g., one or more of silane ($SiH_4$), disilane (e.g., $Si_2H_6$), dicholorosilane (DCS), trichlorosilane (TCS), hexachlorodisilane (HCD), and/or one or more higher-order silanes.

As illustrated in FIG. 6, in some embodiments, the polysilicon fill material 226 is formed to overfill the opening 502 (FIG. 5), such that an overfill portion 602 forms on an upper surface of the dielectric liner material 504, over the upper surface of the stack structure 306. Forming the overfill portion 602 may ensure the polysilicon fill material 226 fully fills the opening 502 (FIG. 5) without leaving divots along the upper surface of the polysilicon fill material 226 (e.g., in an area vertically above, and horizontally aligned with, portion 410). In other embodiments, the polysilicon fill material 226 is formed to fill the opening 502 without forming the overfill portion 602.

The polysilicon fill material 226 may be formed to completely fill the opening 502 (FIG. 5) without substantial defects (e.g., seams, voids, delaminations), even though the opening 502 is a high-aspect-ratio opening. That is, unlike conventional fill materials (e.g., oxide fill materials), the polysilicon fill material 226 may be formed in even a single deposition act (e.g., stage) to form the material with high conformality (e.g., greater than about 90% (based on side-wall thickness to bottom thickness)) on the dielectric liner material 504 to completely fill the opening 502 without forming substantial seams (e.g., seam 130 (FIG. 1)), voids, and delaminations, even though the opening 502 may be a high-aspect-ratio opening. In contrast, forming a conventional fill material in a high-aspect-ratio opening may necessitate multiple deposition and etching acts to avoid formation of seams (e.g., seam 130 (FIG. 1)), voids, and delaminations.

The polysilicon fill material 226, completely filling the opening 502 (FIG. 5), has a greater horizontal width along an upper elevation of the polysilicon fill material 226 than along a lower elevation of the polysilicon fill material 226. That is, as the staircase structures 404 (or staircase structures 218 of FIG. 2) descend toward the base material 210, the polysilicon fill material 226 narrows. In embodiments in which the dielectric liner material 504 conforms to the topography of the opposing staircase structures 404 (e.g., and exhibit steps along the surface of the dielectric liner material 504 facing the opening 502), the polysilicon fill material 226 also exhibits a shape complementary to that of the opposing staircase structures 404 along the lower vertical boundary thereof (e.g., along an outer sidewall of the polysilicon fill material 226). Accordingly, the polysilicon fill material 226 may decrease in width in increments with increasing depth, rather than decreasing in width as a consistently tapering edge defining a wholly angled surface.

Figure 7:
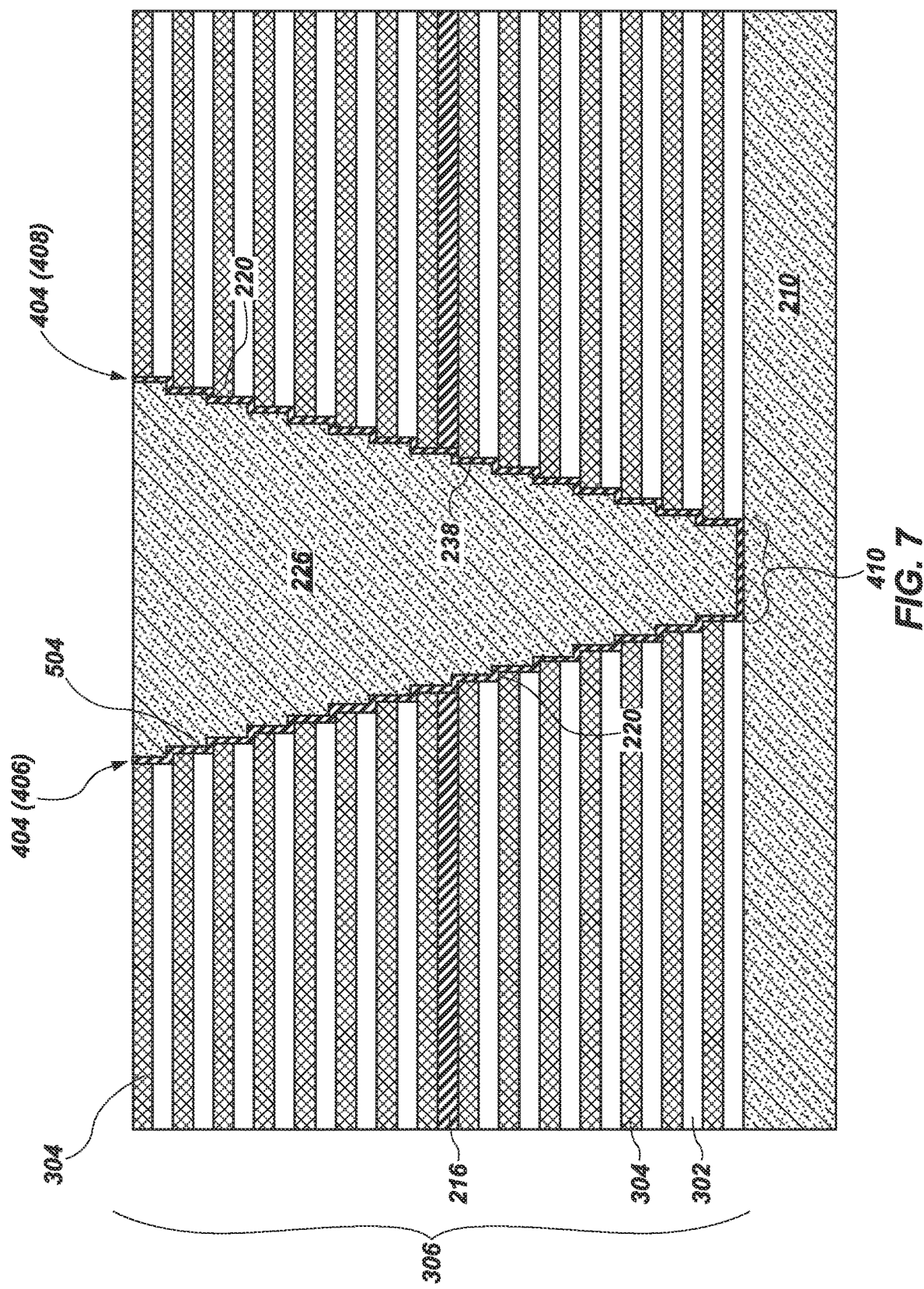

The structure of FIG. 6 may then be subject to planarization (e.g., polishing, such as CMP), as illustrated in FIG. 7, forming the dielectric liner 238 formed from the dielectric liner material 504. As a result of the planarization, an upper surface of the polysilicon fill material 226 is coplanar with an upper surface of the stack structure 306 (e.g., coplanar with an upper surface of an uppermost tier of the stack structure 306). This planarization may remove, if present, the overfill portion 602 (FIG. 6) of the polysilicon fill material 226, uppermost portions of the dielectric liner material 504, and the sacrificial material 312 (FIG. 6) (if the sacrificial material 312 was present). In some embodiments, the planarization may also remove all or part of an uppermost region of the insulative materials 302 of the stack structure 306. An uppermost region of the other materials 304 may remain, either as the uppermost material of the stack structure 306, as illustrated in FIG. 7, or with some or all of the uppermost region of the insulative materials 302 of the stack structure 306.

Figure 8:
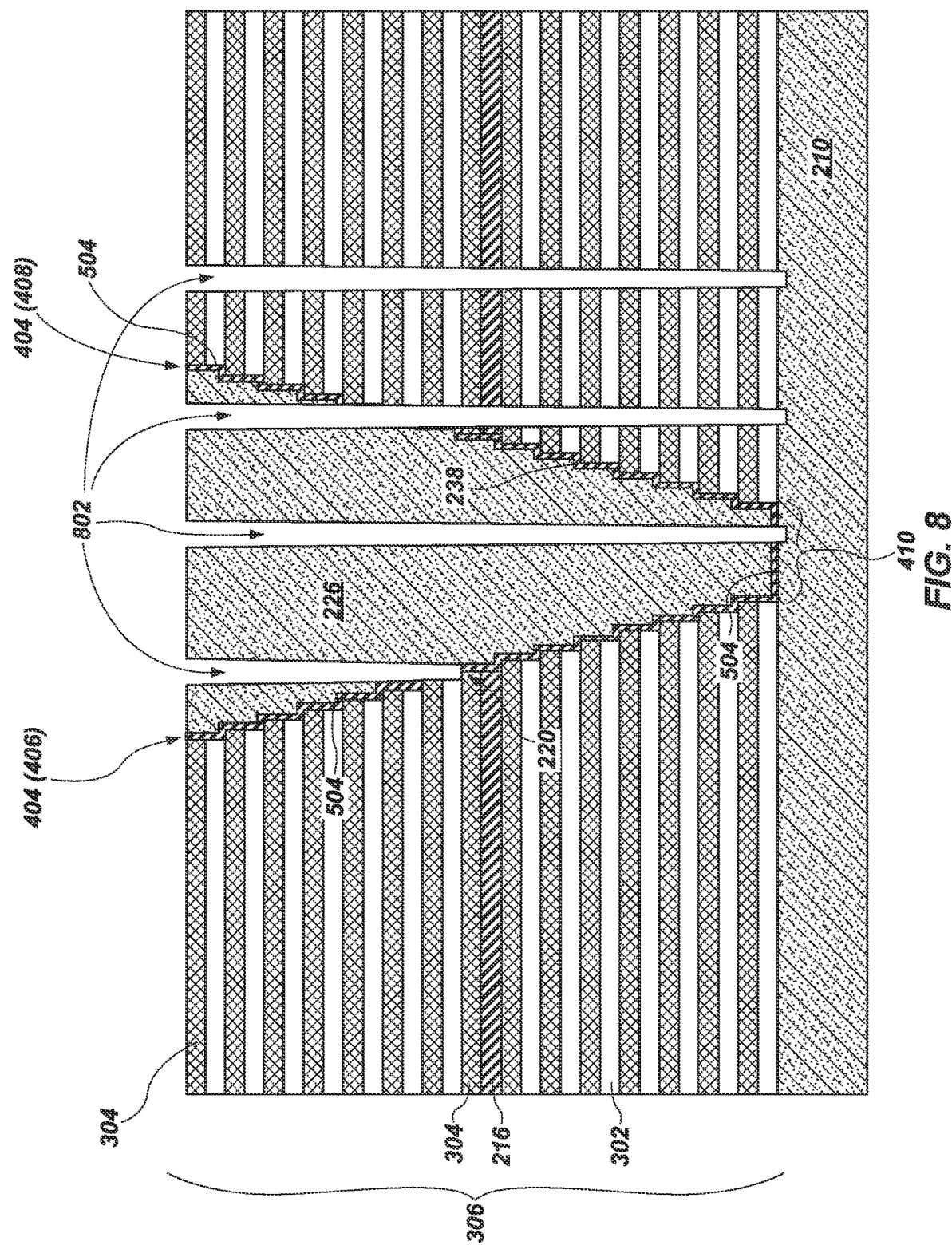

Contact openings 802 may then be formed where the contacts 240 of the microelectronic device structure 200 (FIG. 2) are desired, as illustrated in FIG. 8. The contact openings 802 may be formed (e.g., etched) into the polysilicon fill material 226 alone, into the polysilicon fill material 226 and the stack structure 306, or into the stack structure 306 alone. The contact openings 802 may extend through select portions of the dielectric liner 238 to come into contact with the other materials 304 or the base material 210 previously covered by such select portions of the dielectric liner 238 (e.g., by the dielectric liner material 504).

Depending on the intended function of the contacts 240 (FIG. 2) to be formed in the contact openings 802, the contact openings 802 may extend only to a particular step of the steps 220 of the opposing staircase structures 404 (e.g., for the word line contact 244 of FIG. 2) or to the base material 210 (e.g., for the source/drain contacts 248 or the support contact 250 of FIG. 2). Though not illustrated, one or more of the contact openings 802 may also extend deeper into the base material 210, such as below a source/drain region of the base material 210 (e.g., for a non-electric support contact).

Figure 9:
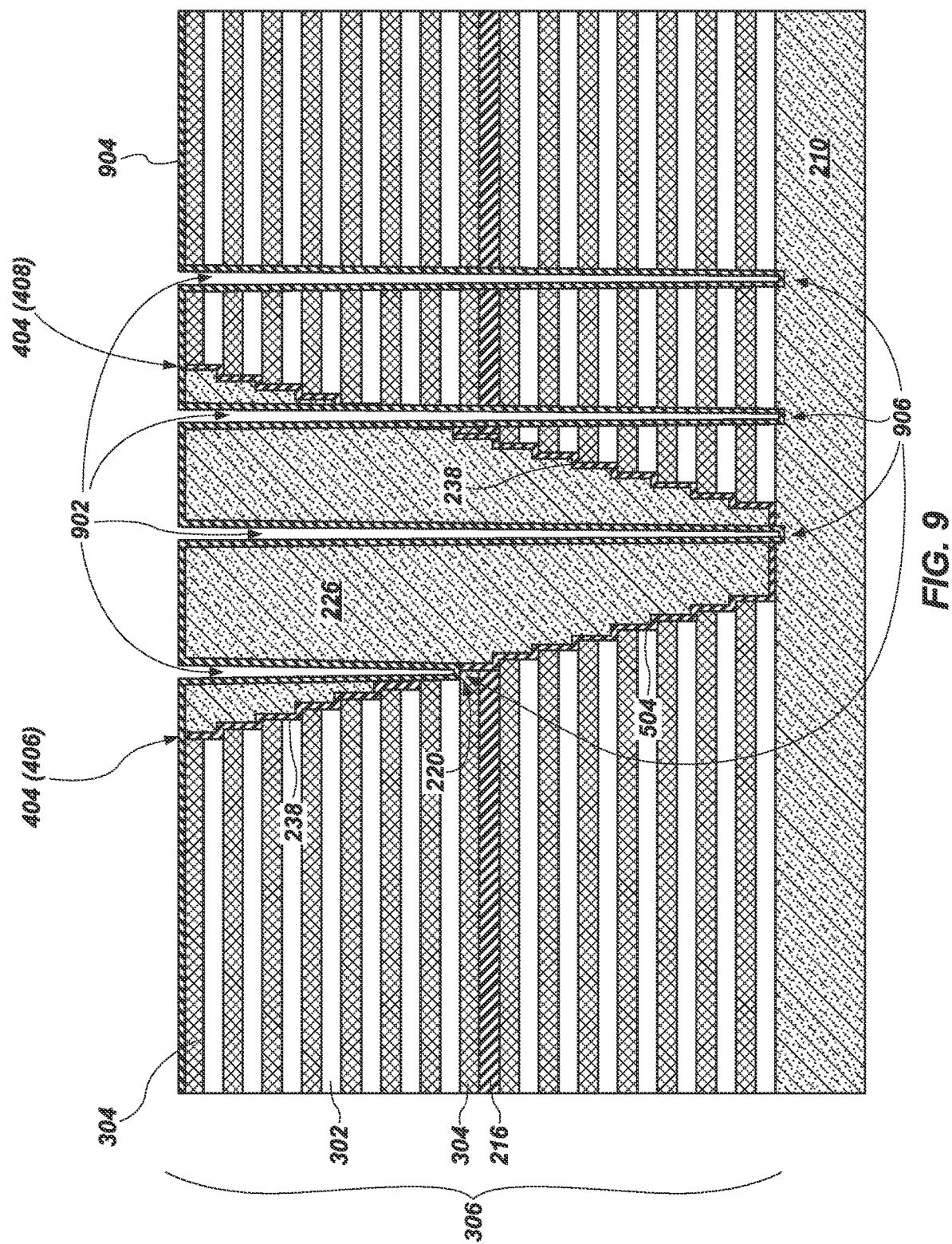

With reference to FIG. 9, another dielectric liner material 904 may then be formed (e.g., conformally formed) (e.g., deposited by ALD, CVD) in the contact openings 802 (FIG. 8). The another dielectric liner material 904 may be formed of and include dielectric material employed for the contact dielectric liner 242 (FIG. 2), as discussed above. In some embodiments, the another dielectric liner material 904 includes multiple materials, e.g., in multiple sub-layers. In other embodiments, the another dielectric liner material 904 is formed of a single (e.g., only one), substantially homogeneous material.

In some embodiments, the another dielectric liner material 904 is formed of and includes the same material(s) (e.g., has the same composition) as the dielectric liner material 504. In other embodiments, the another dielectric liner material 904 and the dielectric liner material 504 have different compositions than one another.

The another dielectric liner material 904 may cover all exposed (e.g., uncovered, bare) surfaces, including an upper surface of the stack structure 306 (e.g., an upper surface of the uppermost other materials 304 or, if present over the uppermost other materials 304, an upper surface of an uppermost region of the insulative materials 302). Resulting lined contact openings 902 include the another dielectric liner material 904 along sidewalls and along floors 906 of the lined contact openings 902.

Figure 10:
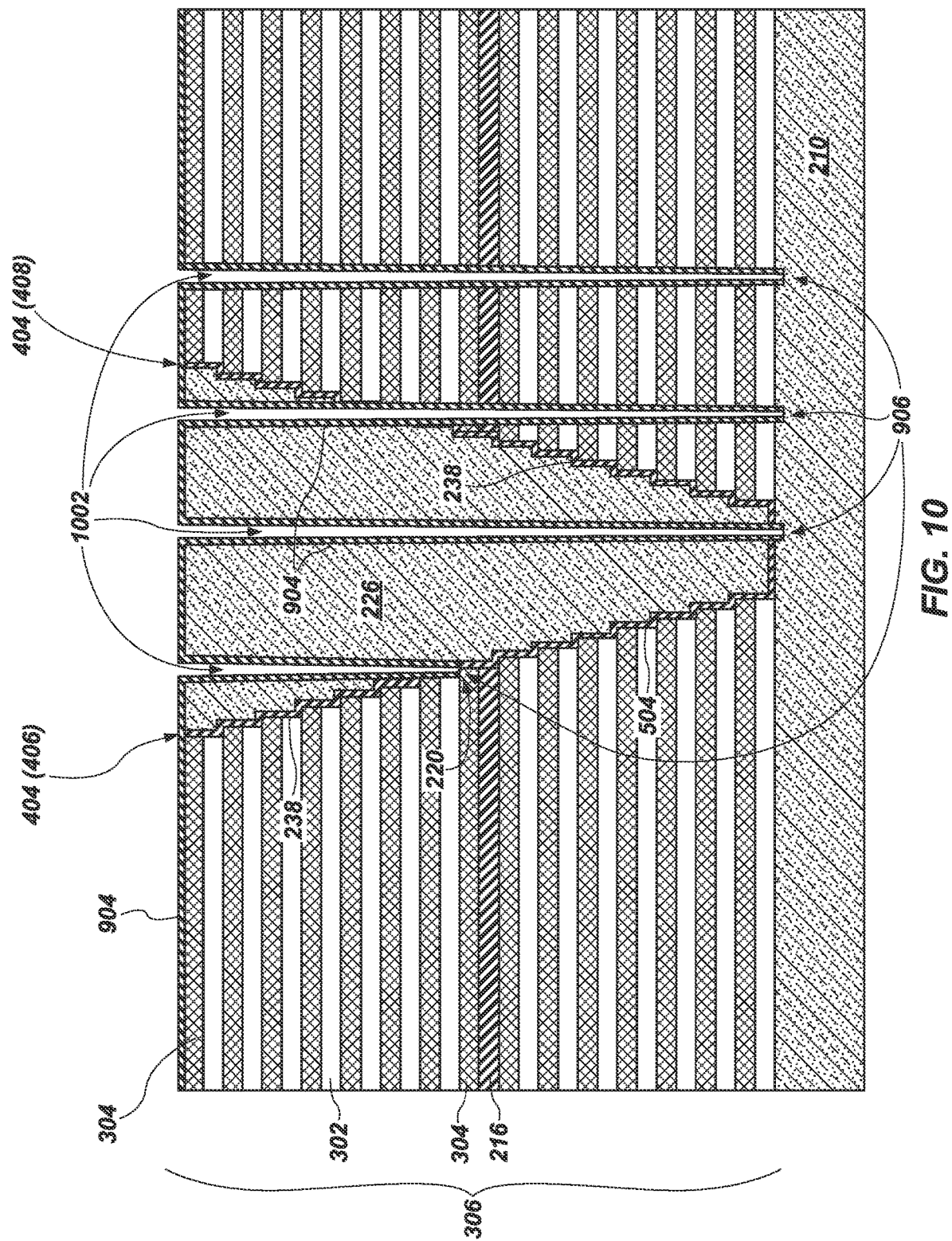

The another dielectric liner material 904 may then be removed from the floors 906 of the lined contact openings 902, e.g., by selectively removing only those portions of the another dielectric liner material 904 overlying the floors 906 (e.g., by etching, such as by anisotropically etching) the another dielectric liner material 904, as illustrated in FIG. 10, forming lined contact openings 1002 exposing underlying material along the floors 906.

The lined contact openings 1002 may have dimensions tailored to accommodate the dimensions of conventional contact materials (e.g., materials of the contacts 116 of FIG. 1). Therefore, when forming the initial contact openings 802, as discussed above with regard to FIG. 8, the contact openings 802 may be formed to have a horizontal width that will accommodate twice the width of the another dielectric liner material 904. In some embodiments, the another dielectric liner material 904 may be formed (e.g., in FIG. 9) to a thickness, along the sidewalls that define the contact openings 802 (FIG. 8) to a thickness of about 20 nm to about 100 nm. Therefore, the contact openings 802 may be formed to be about 40 nm to about 200 nm wider (e.g., in a horizontal direction) than one may have formed contact openings for conventional contacts materials (e.g., for contacts 116 of FIG. 1).

Figure 11:
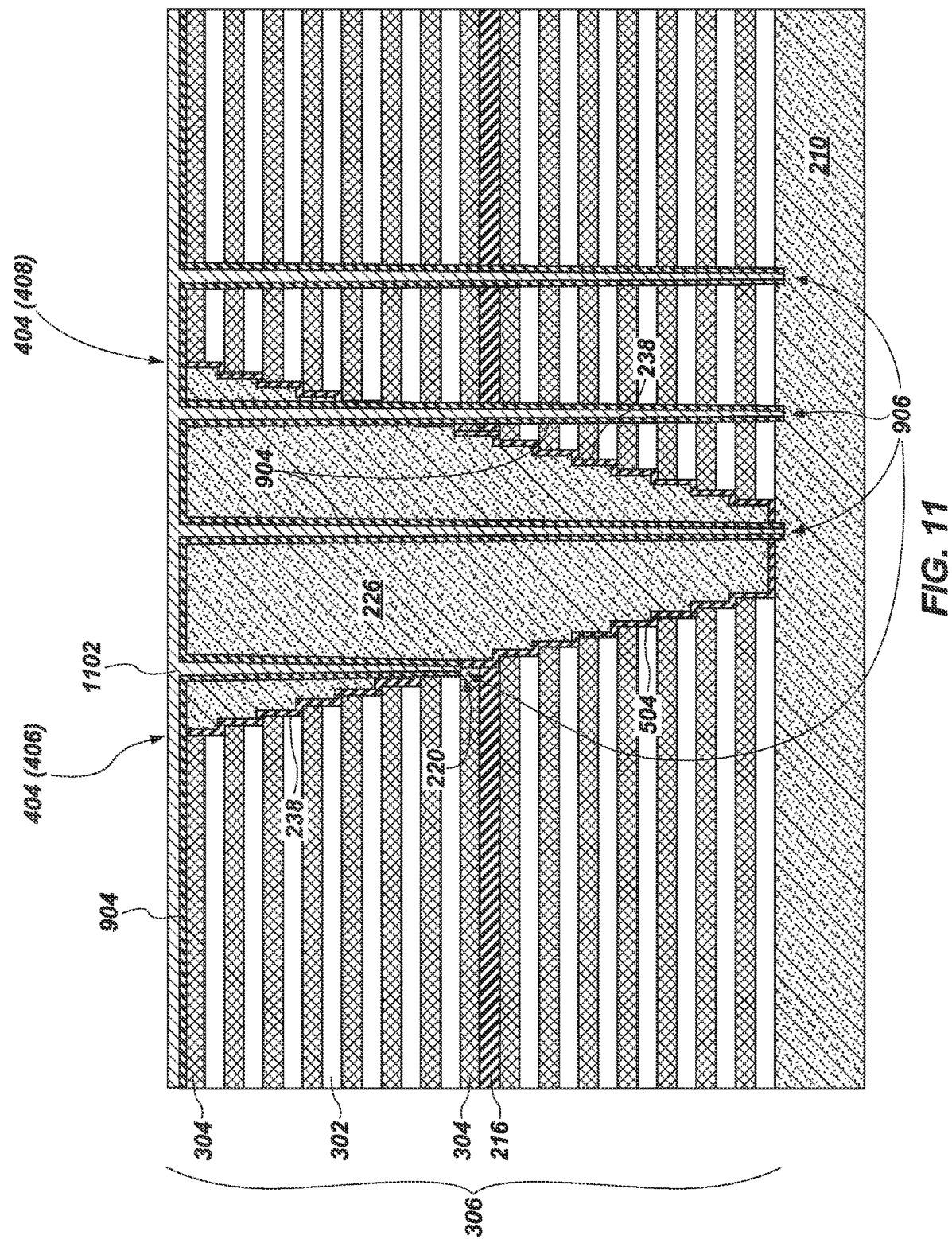

With reference to FIG. 11, a conductive material 1102 may then be formed (e.g., deposited) in the lined contact openings 1002 (FIG. 10). Because forming the conductive material 1102 follows removing the another dielectric liner material 904 from the floors 906, the conductive material 1102 may be formed in direct physical and electrical contact with select steps of the steps 220 or with the base material 210 (e.g., source/drain regions therein). The conductive material 1102 is lined by the another dielectric liner material 904 except for at the floors 906 and along an upper surface of the conductive material 1102.

Figure 12:
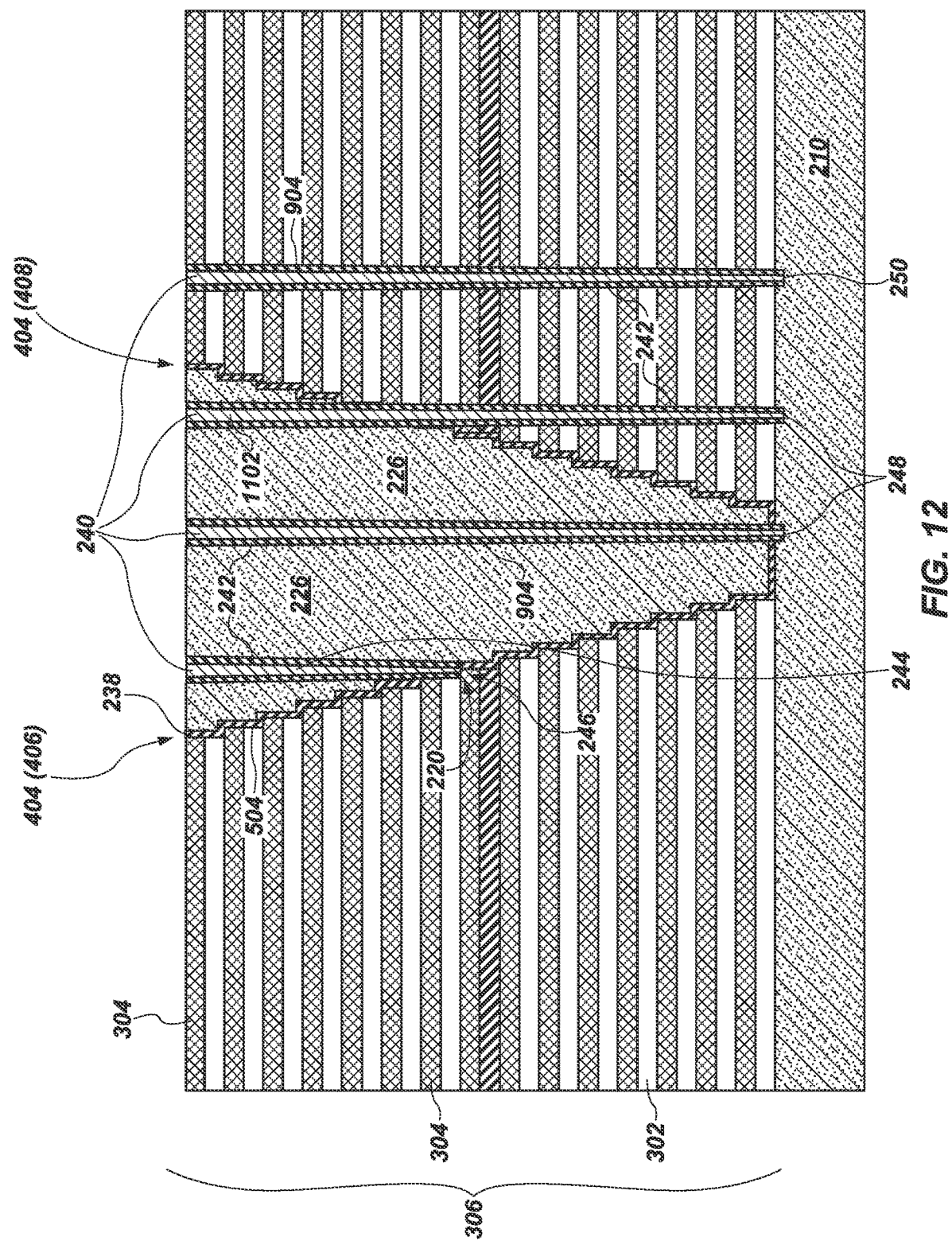

The structure of FIG. 11 may then be subjected to planarization (e.g., polishing, such as CMP) to remove the uppermost portions of the conductive material 1102, isolating the conductive material 1102 within each of the respective lined contact openings 1002 (FIG. 10), as illustrated in FIG. 12. Formed are the contacts 240, including the word line contact 244; the source/drain contacts 248; and the support contact 250. Each of the contacts 240 may be electrically isolated from one another and from the polysilicon fill material 226 by virtue of the contact dielectric liner 242 formed from the another dielectric liner material 904. The polysilicon fill material 226 is lined, first, with the dielectric liner 238 along the steps 220 of the opposing staircase structures 404 and is lined, second, with the contact dielectric liner 242.

After forming the contacts 240, slit 228 (FIG. 2) may be formed (e.g., etched) through the polysilicon fill material 226, and other slits 230 (FIG. 2) may be formed (e.g., etched) through the stack structure 306, to define the blocks 232 (e.g., the first block 234, the second block 236) of FIG. 2, forming the opposing staircase structures 218 of FIG. 2 from the opposing staircase structures 404. In some embodiments, the slit 228 and the other slits 230 may extend into the base material 210. Because of the use of the polysilicon fill material 226 between the opposing staircase structures 404, the blocks 232 (e.g., blocks 234, 236) may not bend or deform during or after the formation of slit 228 and other slits 230. This may be due, at least in part, to the polysilicon fill material 226 having (e.g., exhibiting) a non-compressive stress, at least at the time the slit 228 and the other slits 230 are formed, if not also when the polysilicon fill material 226 is initially formed (e.g., as illustrated in FIG. 6).

The non-compressive stress (e.g., tensile stress) of the polysilicon fill material 226, at least at the time of forming the slit 228 and the other slits 230, may about equal a compressive stress of the materials of the material stack (of stack structure 306), at least at the time of forming the slit 228 and the other slits 230. Therefore, there may be no or minimal residual stress within the stack structure 306 to be released and cause structural deformations (e.g., bending of the blocks 232) when the slit 228 and the other slits 230 are formed. Therefore, the blocks 232 (e.g., blocks 234, 236) may not come into contact with one another, and the slit 228 and the other slits 230 may not form a pinch-off area 124 (FIG. 1) (or areas).

Moreover, because the use of the polysilicon fill material 226 does not result in a stress "mismatch" with neighboring materials in the stack structure 306 and does not result in structural deformations of the blocks 232 (e.g., blocks 234, 236), the contacts 240 may not become misaligned from their intended points of contact (e.g., contact regions of word line contact line tiers (e.g., conductive structures 206) or contact regions within the base material 210). The contacts 240 may also not bend to come into untended close contact that may otherwise form electrical shorts between contacts 240 that should be electrically isolated from one another.

In some embodiments, additional contacts are formed after the blocks 232 (e.g., blocks 234, 236) are formed. Such additional contacts (if any) may be less prone to misalignment and breakdown (e.g., too-close contact with previously formed contacts of the contacts 240) because of the structural stability of the blocks 232 (e.g., blocks 234, 236) enabled by the polysilicon fill material 226 between the opposing staircase structures 218 (FIG. 2).

In embodiments in which the other materials 304 are or include sacrificial materials, processing subsequent to forming the other slits 230 may use conventional methods to remove and replace the other materials 304 from the stack structure 306 with conductive material for the conductive structures 206 of the microelectronic device structure 200 of FIG. 2. The removal of the other materials 304 may be conducted by a so-called "replacement gate" (e.g., "gate last") process. In these embodiments, the dielectric liner material 504 (FIG. 5) (for the dielectric liner 238) along the opposing staircase structures 404 may have been formulated to be resistant to the etchant(s) used in the replacement gate process. For example, the dielectric liner material 504 may be a dielectric oxide (e.g., silicon oxide) or another dielectric material that is resistant to a hot phosphorous etchant. Therefore, the dielectric liner material 504 and the dielectric liner 238 formed therefrom may survive the replacement gate process and be present in the microelectronic device structure 200.

In other embodiments, such as those in which the other materials 304 are not sacrificial but are initially formed as conductive material of the conductive structures 206 (e.g., the other materials 304 is a conductively doped polysilicon), the other materials 304 may not be removed after forming the other slits 230 but may remain in the microelectronic device structure 200 of FIG. 2. In these embodiments, the dielectric liner material 504 (for of the dielectric liner 238) along the opposing staircase structures 404 (FIG. 5) need not be formulated to be resistant to replacement gate process etchants (e.g., hot phosphorus etchants). Such dielectric liner material 504 may be formed of and include at least one dielectric material (e.g., one or more of a dielectric nitride material, such as silicon nitride or silicon dioxide).

Accordingly, disclosed is a method of forming a microelectronic device. The method comprises forming opposing staircase structures in a stack structure comprising insulative materials vertically alternating with other materials. The stack structure is arranged in tiers. The opposing staircase structures comprise steps at lateral ends of the tiers of the stack structure. The method also includes lining the opposing staircase structures with a dielectric material. Polysilicon is formed on the dielectric material to fill an opening between the opposing staircase structures. At least one contact is formed extending through one or more of the polysilicon and the stack staircase structures.

Because the polysilicon fill material 226 may be formed using only one deposition act to completely fill the opening 502 (FIG. 5) between the opposing staircase structures 404 of the stack structure 306 (FIG. 5), the method for forming the microelectronic device structure 200 (FIG. 2) of the disclosure with the polysilicon fill material 226 may be much less complex and much less expensive, compared to conventional processes for forming oxide-based fill material within openings between opposing staircase structures. Conventional processes can require multiple deposition-etch cycles to completely fill the opening to pursue minimal structural defects in the oxide-based fill material. Even in embodiments in which the polysilicon fill material 226 is formed with the overfill portion 602 (FIG. 6) that will be removed in the subsequent processing stage, the overfill portion 602 may be only, e.g., about 20 micrometers (about 20 µm) thick. In comparison, conventional between-staircase fill materials may be formed in multiple repetitions of material depositions and partial material removals (e.g., polishes), and the total amount of fill material removed from such conventional processes may be far greater than the amount of polysilicon fill material 226 removed from the overfill portion 602 in accordance with embodiments of the disclosure. Therefore, not only may the methods of the disclosure eliminate several processing acts, simplifying the fabrication process and relatively shortening the time needed to form a microelectronic device structure with opposing staircase structures and a fill material between, but the methods of the disclosure may also enable a significant cost savings in terms of equipment and materials.

Moreover, as discussed above, using the polysilicon fill material 226 and its non-compressive (e.g., tensile) stress may avoid the residual stresses that may produce structural deformations of blocks and contacts after partitioning stack structures into multiple blocks.

Accordingly, disclosed is a memory device comprising neighboring blocks. The neighboring blocks comprise insulative structures vertically interleaved with conductive structures. The insulative structures and the conductive structures are arranged in opposing staircase structures at opposing horizontal edges of the neighboring blocks. A polysilicon fill material is between the opposing staircase structures. A dielectric liner intervenes between the polysilicon fill material and the conductive structures of the opposing staircase structures.

Figure 13:
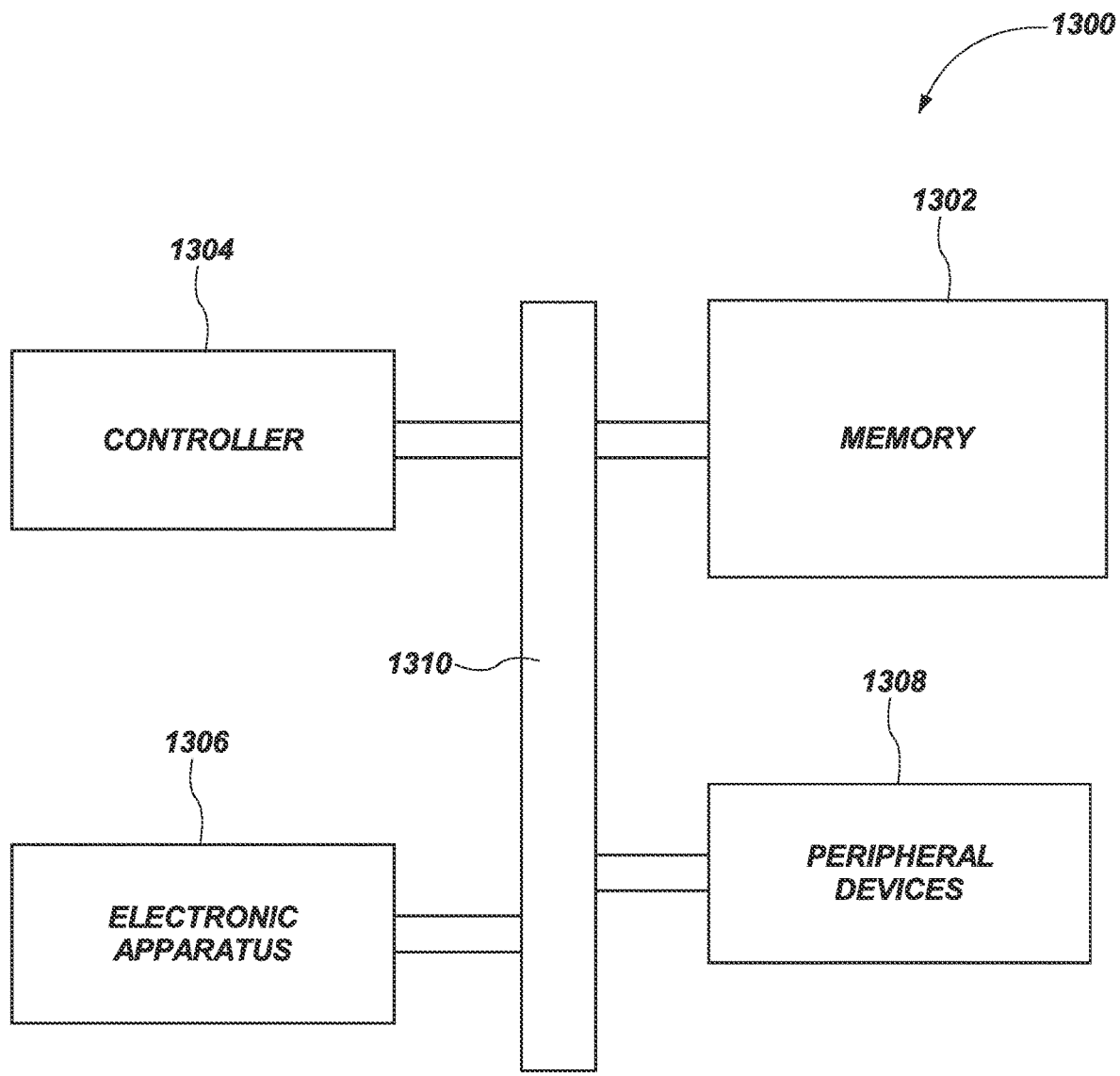
FIG. 13 shows a block diagram of an electronic system including a microelectronic device that includes the microelectronic device structure illustrated in FIG. 2, according to embodiments of the disclosure.

FIG. 13 shows a block diagram of a system 1300, according to embodiments of the disclosure, which system 1300 includes memory 1302 including an array of vertical strings of memory cells. The architecture and structure of the memory 1302 may include the microelectronic device structure 200 of FIG. 2, according to embodiments of the disclosure, and may be fabricated according to one or more of the methods described above with reference to FIG. 3 through FIG. 12.

The system 1300 may include a controller 1304 operatively coupled to the memory 1302. The system 1300 may also include another electronic apparatus 1306 and one or more peripheral device(s) 1308. The other electronic apparatus 1306 may, in some embodiments, include one or more of microelectronic device structures 200 (FIG. 2), according to embodiments of the disclosure and fabricated according to one or more of the methods described above. One or more of the controller 1304, the memory 1302, the other electronic apparatus 1306, and the peripheral device(s) 1308 may be in the form of one or more integrated circuits (ICs).

A bus 1310 provides electrical conductivity and operable communication between and/or among various components of the system 1300. The bus 1310 may include an address bus, a data bus, and a control bus, each independently configured. Alternatively, the bus 1310 may use conductive lines for providing one or more of address, data, or control, the use of which may be regulated by the controller 1304. The controller 1304 may be in the form of one or more processors.

The other electronic apparatus 1306 may include additional memory (e.g., with one or more of the microelectronic device structure 200 (FIG. 2), according to embodiments of the disclosure and fabricated according to one or more of the methods described above). Other memory structures of the memory 1302 and/or the other electronic apparatus 1306 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1308 may include displays, imaging devices, printing devices, wireless devices, additional storage memory, and/or control devices that may operate in conjunction with the controller 1304.

The system 1300 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising a three-dimensional array of memory devices. The three-dimensional array of memory devices comprises stack structures of insulative materials interleaved with conductive materials, which stack structures are partitioned into blocks by slits. The blocks comprise a polysilicon fill material between the slits and the stack structures. The polysilicon fill material incrementally decreases in width with increasing depth toward a base material that is supporting the stack structures. The system also comprises at least one processor and at least one peripheral device. The at least one processor is in operable communication with the three-dimensional array of memory devices. The at least one peripheral device is in operable communication with the at least one processor.

While the disclosed structures, apparatus, systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising insulative structures vertically interleaved with conductive structures and arranged in tiers forming opposing staircase structures having steps at ends of the tiers; and
   a polysilicon structure between the opposing staircase structures and lined by a dielectric material,
   the polysilicon structure decreasing in width in stepwise increments with decreasing elevation from an uppermost elevation of the stack structure to a lowermost elevation of the stack structure.

2. The microelectronic device of claim 1, further comprising a slit structure extending through the polysilicon structure between the opposing staircase structures.

3. The microelectronic device of claim 2, further comprising another slit structure extending through the stack structure and defined in part by a substantially vertical sidewall of the stack structure.

4. The microelectronic device of claim 1, wherein a ratio of an entire height of the polysilicon structure to a greatest width of the polysilicon structure is at least about 1:1.

5. The microelectronic device of claim 1, wherein the dielectric material substantially conforms to the steps of the opposing staircase structures.

6. The microelectronic device of claim 1, wherein a single material layer of the dielectric material separates the polysilicon structure from the steps of the opposing staircase structures.

7. The microelectronic device of claim 1, further comprising at least one contact extending, through one or more of the polysilicon structure and the stack structure, to one of the steps.

8. The microelectronic device of claim 7, further comprising a dielectric liner horizontally interposed between the at least one contact and the one or more of the polysilicon structure and the stack structure.

9. A method of forming a microelectronic device, the method comprising:
   forming a preliminary stack structure comprising insulative structures and other structures vertically interleaved with the insulative structures, the insulative structures and the other structures arranged in tiers each including at least one of the insulative structures and at least one of the other structures;
   patterning the preliminary stack structure to define at least one pair of opposing staircase structures having steps at ends of the tiers;
   forming a dielectric material on the opposing staircase structures of the at least one pair of opposing staircase structures;
   forming a polysilicon material between the at least one pair of opposing staircase structures to form a polysilicon structure lined by the dielectric material, the polysilicon structure incrementally decreasing in width with decreasing elevation from an uppermost elevation of the preliminary stack structure to a lowermost elevation of the preliminary stack structure; and
   substantially replacing the other structures with conductive structures to form a stack structure comprising the insulative structures and the conductive structures vertically interleaved with the insulative structures.

10. The method of claim 9, further comprising forming a slit extending through the polysilicon structure to a source/drain region below the stack structure.

11. The method of claim 9, further comprising forming at least one conductive contact extending through at least a portion of the polysilicon material.

12. A microelectronic device, comprising:
   a stack structure comprising insulative structures and conductive structures vertically interleaved with the insulative structures, the insulative structures and the conductive structures arranged in tiers each including at least one of the insulative structures and at least one of the conductive structures;
   slits extending through the stack structure to divide the stack structure into blocks, at least one of the blocks comprising:
      a staircase structure including steps defined along ends of the tiers of the stack structure; and a polysilicon structure between the staircase structure and one of the slits, the one of the slits bordering the at least one of the blocks, a horizontal distance, between the one of the slits and the steps of the staircase structure, incrementally decreasing with increasing elevational proximity to a source/drain region below the stack structure.

13. The microelectronic device of claim 12, wherein:

the stack structure comprises multiple decks of the insulative structures and the conductive structures, neighboring decks of the multiple decks being spaced from one another by an inter-deck region comprising dielectric material; and the staircase structure descends through the multiple decks.

14. The microelectronic device of claim 12, wherein the staircase structure of the at least one of the blocks is substantially mirrored by an opposing staircase structure of at least one other of the blocks, the at least one other of the blocks bordering the one of the slits.

15. The microelectronic device of claim 12, wherein the one of the slits extends an entire vertical height of the polysilicon structure.

16. The microelectronic device of claim 12, wherein an other of the slits borders the at least one of the blocks and extends an entire vertical height of the stack structure.

17. The microelectronic device of claim 12, further comprising a dielectric liner directly between the polysilicon structure and the staircase structure.

18. The microelectronic device of claim 12, further comprising at least one contact extending through a portion of the polysilicon structure to one of the steps of the staircase structure.

19. The microelectronic device of claim 12, further comprising at least one contact extending through the polysilicon structure to the source/drain region.

20. The microelectronic device of claim 12, further comprising at least one contact extending through at least a portion of the polysilicon and through a portion of the stack structure to the source/drain region.

* * * * *